(12) United States Patent
Carroll

(10) Patent No.: US 6,914,485 B1
(45) Date of Patent: Jul. 5, 2005

(54) HIGH VOLTAGE SUPPLY SENSING HIGH INPUT RESISTANCE OPERATIONAL AMPLIFIER INPUT STAGE

(75) Inventor: Kenneth J. Carroll, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/635,307

(22) Filed: Aug. 5, 2003

(51) Int. Cl.[7] .............................. H03F 3/45; H03F 3/16
(52) U.S. Cl. ........................ 330/258; 330/259; 330/300
(58) Field of Search ................................ 330/252, 253, 330/258, 259, 300

(56) References Cited

U.S. PATENT DOCUMENTS 5,331,210 A * 7/1994 McCarroll ................... 327/58
5,898,341 A * 4/1999 Miyashita ................... 330/253

* cited by examiner

Primary Examiner—Steven J. Mottola
(74) Attorney, Agent, or Firm—Merchant & Gould P.C.

(57) ABSTRACT

A high voltage operational amplifier input stage utilizes a pair of low voltage p-type MOSFET input devices configured to operate at a common mode voltage. The input stage operates between positive and negative voltage supply rails. Common mode bipolar transistor feedback loops force drains of the MOSFETs to track corresponding source potentials. MOSFET substrate connections are maintained at a predetermined level above (or below, depending on the power supply sensing arrangement) the common mode voltage of the input stage to ensure power supply sensing capability. The input stage has a common mode range which includes the supply rail potential, and which tolerates a total supply voltage that exceeds the MOSFET breakdown voltage. The effective threshold voltage of the input devices is increased above the nominal threshold value to sustain the linear operation of the input stage.

21 Claims, 4 Drawing Sheets

HIGH VOLTAGE SUPPLY SENSING HIGH INPUT RESISTANCE OPERATIONAL AMPLIFIER INPUT STAGE

FIELD OF THE INVENTION

The present invention relates to an input stage of an operational amplifier. More particularly, the present invention relates to a high voltage supply sensing high input resistance operational amplifier input stage that utilizes low voltage MOSFET input devices.

BACKGROUND OF THE INVENTION

Implementation of a high voltage operational amplifier having a high input impedance and a common mode input range which includes a negative supply can be achieved using high voltage PMOS or JFET input devices in a traditional differential input stage. In many semiconductor BiCMOS processes, such high voltage PMOS or JFET devices are not available or they suffer from parametric issues such as poor 1/f noise performance due to compromises made during fabrication.

DETAILED DESCRIPTION OF THE PREFERRED EMBODIMENT

Figure 1:
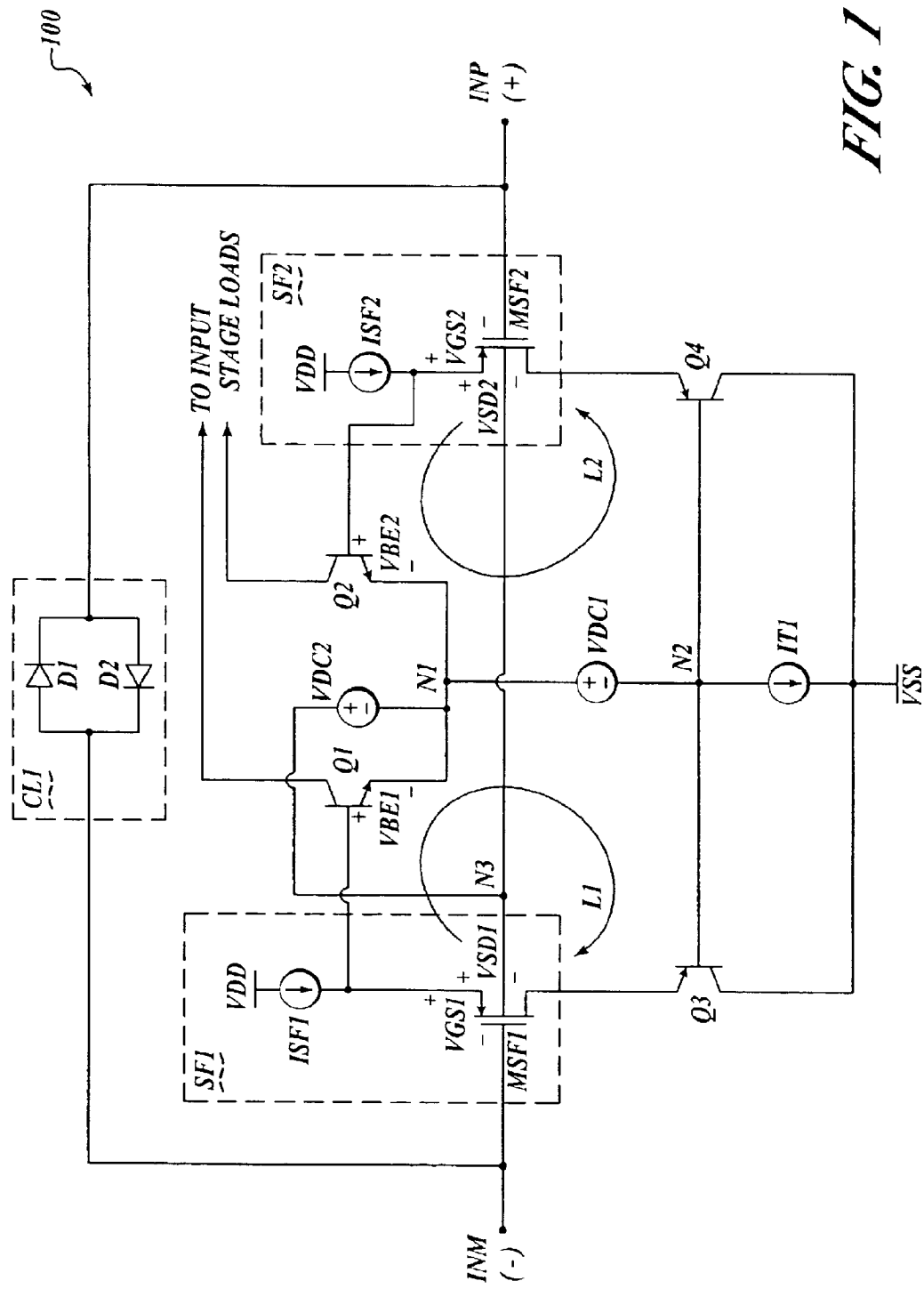
FIG. 1 is a schematic diagram of an example operational amplifier input stage.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meaning of "a," "an," and "the" includes plural reference. The meaning of "in" includes "in" and "on." The term "connected" means a direct connection between the items connected, without any intermediate devices. The term "coupled" refers to both direct connections between the items connected, and indirect connections through one or more intermediary items. The term "circuit" may refer to both single components, and to a multiplicity of components. The term component refers to one or more items that are configured to provide a desired function. The term "signal" includes signals such as currents, voltages, charges, logic signals, data signals, optical signals, electromagnetic waves, as well as others.

Briefly stated, the present invention is related to a high voltage operational amplifier input stage that utilizes a pair of low voltage p-type MOSFET input devices configured to operate at a common mode voltage. The input stage has a high input impedance and operates between positive and negative voltage supply rails. Common mode bipolar transistor feedback loops force drains of the MOSFETs to track corresponding source potentials. A clamp circuit coupled to gates of the MOSFETs minimizes a differential signal at amplifier input terminals to prevent MOSFET breakdown. MOSFET substrate connections are maintained at a predetermined level above (or below, depending on the power supply sensing arrangement) the common mode voltage of the input stage to ensure power supply sensing capability. The input stage has a common mode range which includes the supply rail potential, and which tolerates a total supply voltage that exceeds the MOSFET breakdown voltage. The effective threshold voltage of the input devices is increased above the nominal threshold value to sustain the linear operation of the input stage.

FIG. 1 is a schematic diagram of an exemplary operational amplifier input stage that is arranged in accordance with the present invention. The input stage (100) includes a clamp circuit (CL1), two source follower circuits (SF1, SF2), four transistors (Q1, Q2, Q3, Q4), two voltage sources ($V_{DC1}$, $V_{DC2}$), and a current source ($I_{T1}$).

Clamp circuit CL1 includes two diodes (D1, D2). The anode of diode D1 and the cathode of diode D2 are coupled to inverting input terminal INM. The cathode of diode D1 and the anode of diode D2 are coupled to non-inverting input terminal INP.

Source follower circuit SF1 includes a current source ($I_{SF1}$) and a low voltage MOSFET (MSF1). Current source $I_{SF1}$ is coupled between $V_{DD}$ and the source of transistor MSF1. The gate of transistor MSF1 is coupled to inverting input terminal INM. The drain of transistor MSF1 is coupled to the emitter of transistor Q3. Source follower circuit SF2 includes a current source ($I_{SF2}$) and a low voltage MOSFET (MSF2). Current source $I_{SF2}$ is coupled between $V_{DD}$ and the source of transistor MSF2. The gate of transistor MSF2 is coupled to non-inverting input terminal INP. The drain of transistor MSF2 is coupled to the emitter of transistor Q4. The substrate terminals of transistors MSF1, MSF2 are coupled to node N3.

The base of transistor Q1 is coupled to the source of transistor MSF1. The collector of transistor Q1 is coupled to input stage loads of the amplifier. The emitter of transistor Q1 is coupled to node N1. The base of transistor Q2 is coupled to the source of transistor MSF2. The collector of transistor Q2 is coupled to the input stage loads of the amplifier. The emitter of transistor Q2 is coupled to node N1. Transistors Q1, Q2 operate as an input differential pair to drive current to the input stage loads which may be a resistive load or an active load. In one embodiment, the input stage load of the amplifier is a folded cascode stage.

The positive terminal of voltage source $V_{DC2}$ is coupled to node N3. The negative terminal of voltage source $V_{DC2}$ is coupled to node N1. The positive terminal of voltage source $V_{DC1}$ is coupled to node N1. The negative terminal of voltage source $V_{DC1}$ is coupled to node N2. Current source $I_{T1}$ is coupled between node N2 and $V_{SS}$. Transistors Q3, Q4 are configured as emitter followers. The bases of transistors Q3, Q4 are coupled to node N2, and the collectors of transistors Q3, Q4 are coupled to $V_{SS}$.

The amplifier operates over a high supply voltage range (e.g., $V_{DD}-V_{SS}=24$ volts). The high supply voltage can be any voltage that exceeds the breakdown voltage between any pair of terminals of transistors MSF1, MSF2. Some parameters associated with transistors MSF1, MSF2 can prevent amplifier operation over the full 24-volt input signal range. In one example semiconductor process, transistors MSF1, MSF2 cannot tolerate more than a 5-volt difference in potential between any pair of transistor terminals. For this example, source follower circuits SF1, SF2 and voltage source $V_{DC1}$ are arranged to limit the source-to-drain voltages ($V_{SD1}$, $V_{SD2}$) of transistors MSF1, MSF2 to less than 5 volts such that the amplifier is operational over the 24-volt supply range.

Source follower circuits SF1, SF2 provide a high input impedance for the amplifier at input terminals INP, INM. Current sources $I_{SF1}$, $I_{SF2}$ are arranged to bias transistors MSF1, MSF2. Transistors MSF1, MSF2 are p-type MOSFETs such that the amplifier can operate with input signals down to $V_{SS}$. The bottom supply voltage rail ($V_{SS}$) may be a reference ground for the amplifier or a negative voltage value with respect to the signal ground. In other words, the operational amplifier is a ground-sensing amplifier. The ground-sensing characteristic of the operational amplifier is applicable to single voltage supply systems.

Transistors MSF1, MSF2 preferably are enhancement devices such that transistors Q3, Q4 remain active during ground-sensing (i.e., when input terminals INP, INM are at ground). If the threshold voltages of transistors MSF1, MSF2 are not enhanced, transistors Q3, Q4 are inactive during ground-sensing. The common mode voltage of the amplifier is observed at common emitter node N1. Voltage source $V_{DC2}$ is generally required. However, voltage source $V_{DC2}$ is not required when the threshold voltages of transistors MSF1, MSF2 are sufficiently high such that current source $I_{T1}$ is not forced into saturation when input terminals INP, NM are at a negative supply voltage. Voltage source $V_{DC2}$ generates a positive input tracking voltage that is higher than the common mode voltage. The positive input tracking voltage is arranged to bias the substrate connection of transistors MSF1, MSF2 at node N3. The substrate connection of transistors MSF1, MSF2 is arranged to increase the threshold voltages.

A conventional differential pair formed by transistors Q1, Q2 is arranged to compare the signals from source follower circuits SF1, SF2 and drive currents to the next amplifier stage. The absolute threshold voltage values of source follower circuits SF1, SF2 do not affect amplifier operation as long as source follower circuits SF1, SF2 are matched. In other words, an offset that is introduced on input terminal INP is matched on input terminal INM when the threshold voltages of source follower circuits SF1, SF2 match. Gate-to-source voltages ($V_{GS1}$, $V_{GS2}$) of transistors MSF1, MSF2 are controlled by the transistor operating current and the potential difference between the substrate terminal and the transistor gate. Ideally, gate-to-source voltage $V_{GS1}$ of transistor MSF1 matches gate-to-source voltage $V_{GS2}$ of transistor MSF2 such that the offset between the base voltages of transistors Q1, Q2 is zero.

The drain voltage of transistors MSF1, MSF2 track the source voltages through common mode loops L1 and L2. No offset exists between source-to-drain voltages $V_{SD1}$, $V_{SD2}$ such that voltage source $V_{DC1}$ clamps source-to-drain voltages $V_{SD1}$, $V_{SD2}$. In one embodiment, voltage source $V_{DC1}$ is approximately 400 mV. Specifically, common mode loop L1 formed by the threshold voltage of transistor MSF1, the base-emitter voltage of transistor Q1, voltage source $V_{DC1}$ and the base-emitter voltage of transistor Q3 maintains source-to-drain voltage $V_{SD1}$ at 400 mV. The source-to-drain voltage $V_{SD1}$ remains at 400 mV during ground-sensing because the gate-to-source voltages $V_{GS1}$, $V_{GS2}$ of transistors MSF1, MSF2 is greater than the base-to-emitter voltages $V_{BE1}$, $V_{BE2}$ of transistors Q3, Q4 plus the value of voltage source $V_{DC1}$. This result may be due to the threshold voltage of transistors MSF1, MSF2 being naturally higher than the base-to-emitter voltages $V_{BE1}$, $V_{BE2}$ of transistors Q3, Q4 or due to the intentional substrate bias effect introduced by voltage source $V_{DC2}$. Common mode loop L2 is formed by the threshold voltage of transistor MSF2, the base-emitter voltage of transistor Q2, voltage source $V_{DC1}$, and the base-emitter voltage of transistor Q4.

Voltage source $V_{DC2}$ insures that the potential at the substrate connection of transistors MSF1, MSF2 (node N3) tracks the common mode voltage such that transistors MSF1, MSF2 do not sustain more than 5 volts across any terminal pair associated with those transistors. The emitter voltages of transistors Q1, Q2 track variations in the voltage at input terminals INP, INM. In other words, the voltage drops around common mode loops L1, L2 track the common mode voltage of the amplifier.

If the substrate connection is coupled to the source terminal, the threshold voltage in a typical low voltage PMOS device may be approximately 0.7 volts. The substrate terminal and the source terminal of transistors MSF1, MSF2 can be selected as approximately four diode voltage drops dissimilar, i.e., the substrate terminal is approximately 2.8 volts above the gate terminal. The threshold voltage of transistors MSF1, MSF2 increases as the substrate connection becomes more positive biased to insure that current source $I_{T1}$ remains active and that the gate-to-source voltages $V_{GS1}$, $V_{GS2}$ of transistors MSF1, MSF2 exceeds the base-to-emitter voltages $V_{BE1}$, $V_{BE2}$ of transistors Q1, Q2 plus the value of voltage source $V_{DC1}$.

Current source $I_{T1}$ biases transistors Q1 and Q2. In one embodiment, current source $I_{T1}$ provides a 100 $\mu$A current to transistors Q1 and Q2. Current source $I_{T1}$ also provides the base current for transistors Q3 and Q4. In one embodiment, current source $I_{T1}$ provides a 1 $\mu$A base current to transistors Q3 and Q4.

Clamp circuit CL1 assists tracking in common mode loops L1, L2 when a fast slewing, large voltage input signal is applied to input terminals INP, INM. For example, in one embodiment, a square wave input voltage signal is applied to input terminals INP, INM and the amplifier is configured to operate as a buffer, i.e., input terminal INM is coupled to the output of the amplifier. In this example, a large potential difference may occur between input terminals INP, INM. In one embodiment, the difference in potential is 24 volts. Capacitances at the output of the buffer prevents the amplifier from quickly responding to the large difference in potential. Common mode loops L1, L2 cannot control both transistors MSF1, MSF2 when a large differential signal is applied to input terminals INP, INM due to the large difference in gate voltages.

Clamp circuit CL1 protects input terminals INP, INM from excessive voltage. Clamp circuit CL1 forces inverting input terminal INM to track the voltage at non-inverting input terminal INP when non-inverting input terminal INP experiences a very fast transient large signal swing. In one embodiment, the excessive voltage is a voltage greater than 5 volts. Clamp circuit CL1 insures that the difference in voltage applied to source follower circuits SF1, SF2 does not exceed one diode voltage drop. In other words, diodes D1, D2 clamp the DC level difference between the potential at input terminals INP, INM to approximately 0.7 volts (the diode voltage).

The collector voltage of transistor Q1 should match the collector voltage of transistor Q2 to insure proper amplifier operation. Clamp circuit CL1 can operate external to the operational amplifier. In another embodiment, clamp circuit CL1 may not be required for slow changing input voltage signals unless the amplifier is used as a comparator.

Figure 2:
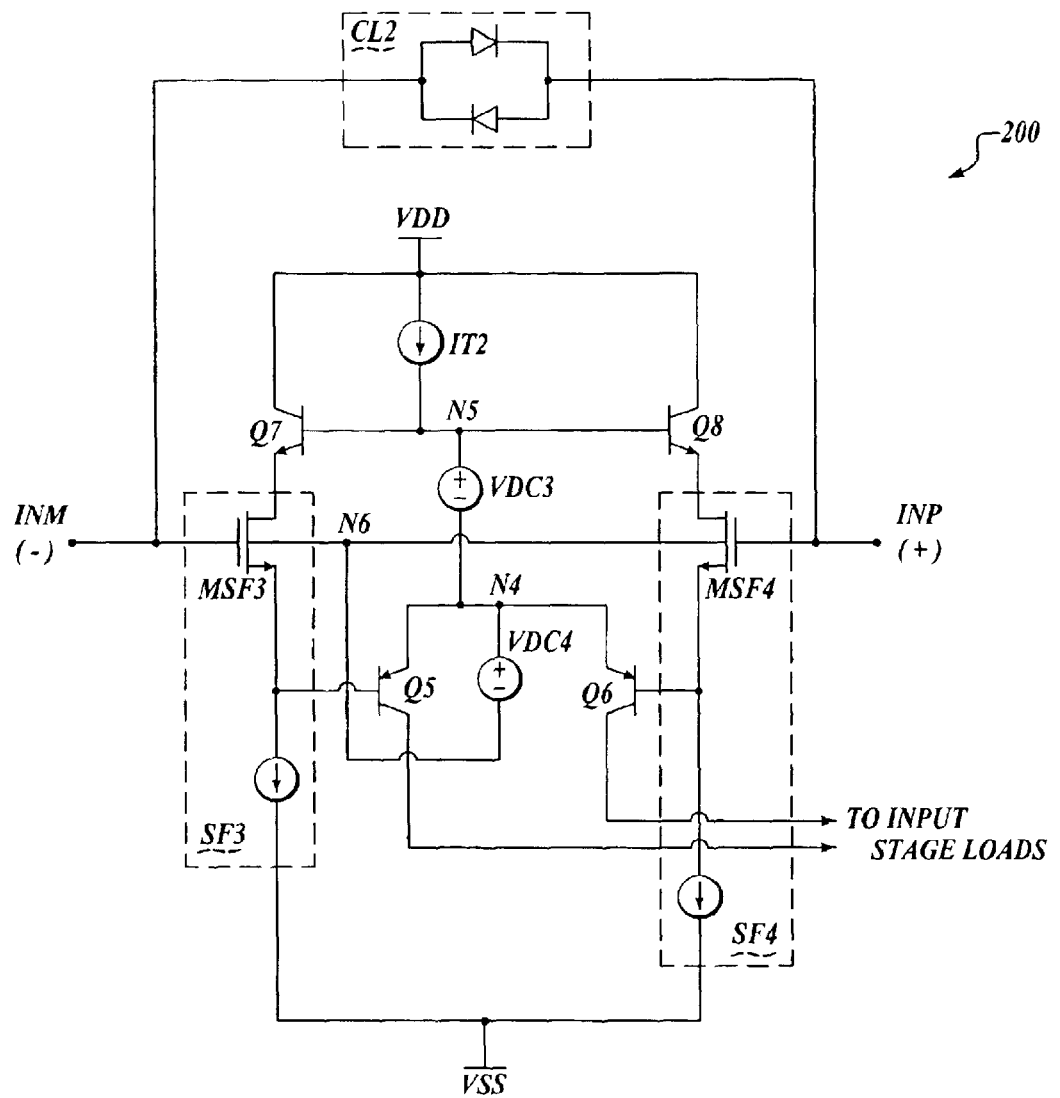
FIG. 2 is a schematic diagram of an example operational amplifier input stage.

FIG. 2 is a schematic diagram of an exemplary operational amplifier input stage that is arranged in accordance with the present invention. The input stage (200) includes a clamp circuit (CL2), two source follower circuits (SF3, SF4), four transistors (Q5, Q6, Q7, Q8), two voltage sources ($V_{DC3}$, $V_{DC4}$), and a current source ($I_{T2}$).

Clamp circuit CL2 is coupled between inverting input terminal INM and non-inverting input terminal INP. Source follower circuit SF3 is coupled to $V_{SS}$, inverting input terminal INM, the emitter of transistor Q7, the base of transistor Q5, and node N6. Source follower circuit SF4 is coupled to $V_{SS}$, non-inverting input terminal INP, the emitter of transistor Q8, the base of transistor Q6, and node N6.

The collector of transistor Q5 is coupled to input stage loads of the amplifier. The emitter of transistor Q5 is coupled to node N4. The collector of transistor Q6 is coupled to the input stage loads of the amplifier. The emitter of transistor Q6 is coupled to node N4.

The positive terminal of voltage source $V_{DC4}$ is coupled to node N4. The negative terminal of voltage source $V_{DC4}$ is coupled to node N6. The positive terminal of voltage source $V_{DC3}$ is coupled to node N5. The negative terminal of voltage source $V_{DC3}$ is coupled to node N4. Current source $I_{T2}$ is coupled between node N5 and $V_{DD}$. Transistors Q7, Q8 are configured as emitter followers. The bases of transistors Q7, Q8 are coupled to node N5, and the collectors of transistors Q7, Q8 are coupled to $V_{DD}$.

Input stage 200 operates in substantially the same way as input stage 100 described in reference to FIG. 1. The primary difference between the two input stages is that input stage 200 is referenced to $V_{DD}$ rather than the $V_{SS}$ signal ground. Transistors MSF3, MSF4 of source follower circuits SF3, SF4 are n-type MOSFETs such that the amplifier can operate with signals up to $V_{DD}$.

Figure 3:
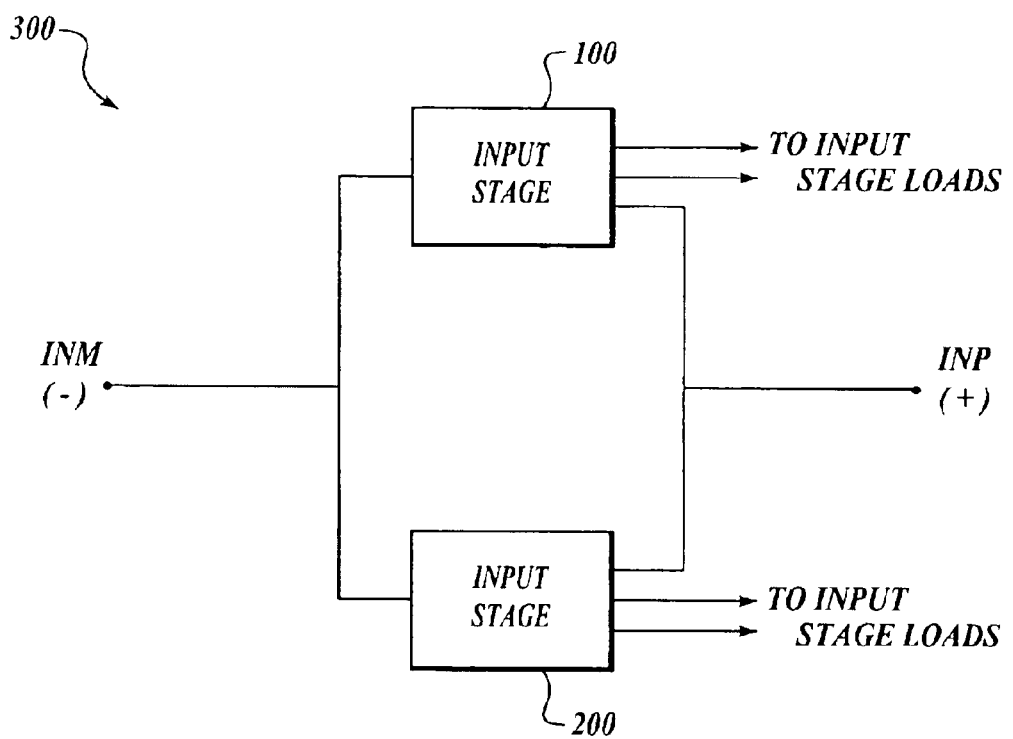
FIG. 3 is a schematic diagram of an example operational amplifier input stage.

FIG. 3 is a schematic diagram of an exemplary operational amplifier input stage that is arranged in accordance with the present invention. The input stage (300) includes input stage 100 and input stage 200 coupled together such that the inverting input terminal of input stage 100 is coupled to the inverting input terminal of input stage 200, and the non-inverting terminal of input stage 100 is coupled to the non-inverting input terminal of input stage 200. Input stage 300 allows for a rail-to-rail common mode input range such that the amplifier can operate with input signals up to $V_{DD}$ and down to $V_{SS}$.

Figure 4:
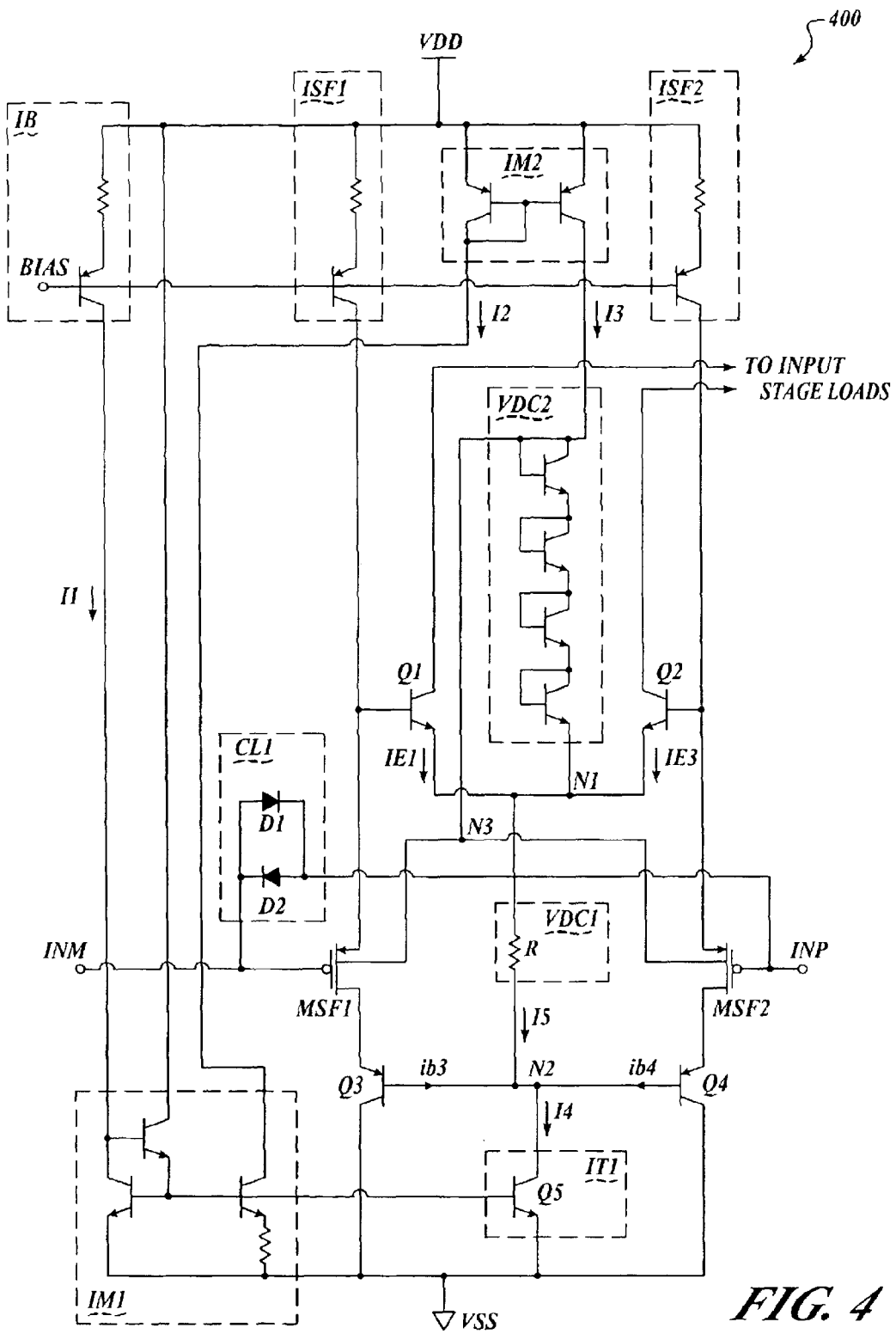
FIG. 4 is a schematic diagram of an example operational amplifier input stage, in accordance with aspects of the present invention.

FIG. 4 is a schematic diagram of an exemplary operational amplifier input stage that is arranged in accordance with the present invention. The input stage (400) includes clamp circuit CL1, current sources $I_{SF1}$, $I_{SF2}$, transistors Q1, Q2, Q3, Q4, MSF1, MSF2, voltage sources $V_{DC1}$, $V_{DC2}$, current source $I_{T1}$ two mirror current sources ($I_{M1}$, $I_{M2}$), and bias current source ($I_B$).

Bias current source $I_B$ provides bias current $I_1$ to mirror current source $I_{M1}$ in response to bias signal BIAS. Mirror current source $I_{M1}$ is illustrated as a base current compensated-type current mirror that reflects bias current $I_1$ to mirror current source $I_{M2}$ as current $I_2$. Mirror current source $I_{M2}$ reflects current $I_2$ to voltage source $V_{DC2}$ as current $I_3$. Current $I_3$ biases voltage source $V_{DC2}$ which is illustrated as four stacked diodes. Any number of diodes could be used to represent voltage source $V_{DC2}$ as long as the diodes track the input voltage signal of the amplifier. In another embodiment, voltage source $V_{DC2}$ could be a resistor or any other electrical element that causes voltage source $V_{DC2}$ to track the input voltage signal. A small current (e.g., $I_3$=1 µA) is sufficient to maintain the four diodes in their active regions.

Voltage source $V_{DC1}$ is illustrated as a resistor (R). In one embodiment, the value of resistor R is selected to provide 400 mV. Voltage source $V_{DC1}$ could be a diode or any other electrical element that provides a controlled difference in potential between nodes N1, N2.

Current source $I_{T1}$ is illustrated as transistor Q5 that provides current $I_4$. In one embodiment, current $I_4$ is 100 µA. Current $I_4$ is reduced by the base currents of transistors Q3, Q4 and current $I_3$ (i.e., $I_5$=$I_3$+$I_{E1}$+$I_{E2}$=$I_4$−$i_{b3}$−$i_{b4}$). Transistor Q5 is deactivated when the collector-base junction forward biases, such that current $I_4$ is approximately zero. The base voltage of transistors Q3, Q4 cannot be less than a predetermined value above ground (e.g., 50–100 mV). Transistors Q3, Q4 limit the gate-to-drain voltage of transistors MSF1, MSF2, i.e., transistors Q3, Q4 cause the drain to follow the source.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An input stage for an operational amplifier that is arranged to operate with a high supply voltage, comprising:
   a first source follower circuit that is configured to receive a non-inverting input signal at a first input, and arranged to provide a first input signal in response to the non-inverting input signal;
   a second source follower circuit that is configured to receive an inverting input signal at a second input, and arranged to provide a second input signal in response to the inverting input signal;
   a differential transistor pair that includes a first and second transistor, wherein the first transistor is arranged to provide a first current in response to the first input signal, and wherein the second transistor is arranged to provide a second current in response to the second input signal, wherein the first and second currents flow into a first node that is common between the first transistor and the second transistor;
   a third transistor that is coupled between the first source follower circuit and a power supply node, wherein the third transistor includes a control terminal that is coupled to a second node;
   a fourth transistor that is coupled between the second source follower circuit and the power supply node, wherein the fourth transistor includes a control terminal that is coupled to the second node;
   a current source that is coupled between the second node and the power supply node; and
   a first voltage source that is coupled between the first node and the second node.

2. The input stage of claim 1, wherein the first transistor and the second transistor are field effect transistor devices that are process limited to operate at voltages that are substantially below the high supply voltage.

3. The input stage of claim 1, further comprising a second voltage source that is coupled between a third node and the first node, wherein the third node is associated with the substrate connections of the first transistor and the second transistor.

4. The input stage of claim 3, wherein the second voltage source is arranged such that the threshold voltages associated with the first transistor and the second transistor track changes in the common-mode voltage.

5. The input stage of claim 3, wherein the second voltage source comprises at least one of: a diode circuit, a stacked diode circuit, a resistor circuit, and a transistor circuit that is biased to operate as a resistor.

6. The input stage of claim 1, wherein the first voltage source comprises at least one of: a diode circuit, a stacked diode circuit, a resistor circuit, and a transistor circuit that is biased to operate as a resistor.

7. The input stage of claim 1, wherein the first transistor is a field effect transistor, and wherein the drain voltage of the first transistor tracks changes in the source voltage of the first transistor through a first common-mode loop; and wherein the second transistor is a field effect transistor, and wherein the drain voltage of the second transistor tracks changes in the source voltage of the second transistor through a second common-mode loop.

8. The input stage of claim 1, further comprising a clamp circuit that is coupled between the first input and the second input.

9. The input stage of claim 8, wherein the clamp circuit comprises a first diode that is coupled in parallel with a second diode such that the anode of the first diode is coupled to the cathode of the second diode.

10. The input stage of claim 1, wherein the source follower circuits are arranged to provide high input impedances for the first and second inputs of the operational amplifier.

11. The input stage of claim 1, wherein the operational amplifier is configured to operate as a ground sensing amplifier that is operable with an input common-mode signal that is at a voltage associated with the power supply node.

12. The input stage of claim 11, wherein the voltage associated with the power supply node is one of a low power supply voltage and a high power supply voltage.

13. The input stage of claim 1, wherein the first and second transistors are bipolar junction transistors that are configured with a common emitter at the first node.

14. The input stage of claim 1, wherein the first and second transistors are field effect transistors that are configured with a common source at the first node.

15. The input stage of claim 1, wherein the first voltage source is arranged to limit a voltage associated with the source follower circuits below a predetermined maximum value.

16. The input stage of claim 1, further comprising a second voltage source that is coupled to the differential transistor pair and that is arranged to generate a tracking voltage signal that tracks the input signals, the tracking voltage signal being greater than the common mode signal such that the threshold voltages associated with the source follower circuits track the common mode signal.

17. An input stage for an operational amplifier that is arranged to operate with high supply voltage, comprising:
a first means for shifting the DC level associated with a first input to provide a first intermediate signal;
a second means for shifting the DC level associated with a second input to provide a second intermediate signal;
a means for sensing a difference between the first intermediate signal and the second intermediate signal, wherein the means for sensing is coupled to a first node that has a voltage that is associated with a common-mode level for the first and second inputs;
a first means for controlling the voltages associated with the first means for shifting such that the voltages associated with the first means for shifting do not exceed a process limit, wherein the first means for controlling is responsive to the common-mode level; and
a second means for controlling the voltages associated with the second means for shifting such that the voltages associated with the second means for shifting do not exceed the process limit, wherein the first means for controlling is responsive to the common-mode level.

18. The input stage of claim 17, further comprising a means for clamping the voltages associated with the first input and the second input.

19. A method for providing an increased operating range in an operational amplifier that is operated from a high supply voltage, the method comprising:
shifting the DC level associated with a first input with a first follower circuit to provide a first intermediate signal;
shifting the DC level associated with a second input with a second follower circuit to provide a second intermediate signal;
sensing a difference between the first intermediate signal and the second intermediate signal;
sensing a common-mode level that is associated with the first and second intermediate signals;
controlling the voltage associated with the first follower circuit in response to the sensed common-mode level, such that the voltage associated with the first follower circuit does not exceed a process limit; and
controlling the voltage associated with the second follower circuit in response to the sensed common-mode level, such that the voltage associated with the second follower circuit does not exceed the process limit.

20. The method of claim 19, further comprising clamping the voltages associated with the first input and the second input.

21. A rail-to-rail input stage for an operational amplifier that is arranged to operate with a high supply voltage, comprising:
a first input circuit comprising:
a first source follower circuit that is configured to receive a non-inverting input signal at a first input, and arranged to provide a first input signal in response to the non-inverting input signal;
a second source follower circuit that is configured to receive an inverting input signal at a second input, and arranged to provide a second input signal in response to the inverting input signal;
a first differential transistor pair that includes a first and second transistor, wherein the first transistor is arranged to provide a first current in response to the first input signal, and wherein the second transistor is arranged to provide a second current in response to the second input signal, wherein the first and second currents flow into a first node that is common between the first transistor and the second transistor;
a third transistor that is coupled between the first source follower circuit and a high power supply node, wherein the third transistor includes a control terminal that is coupled to a second node;
a fourth transistor that is coupled between the second source follower circuit and the high power supply node, wherein the fourth transistor includes a control terminal that is coupled to the second node;

a first current source that is coupled between the second node and the high power supply node; and a first voltage source that is coupled between the first node and the second node; and a second input circuit comprising:

a third source follower circuit that is configured to receive the non-inverting input signal at a third input, and arranged to provide a third input signal in response to the non-inverting input signal;

a fourth source follower circuit that is configured to receive the inverting input signal at a fourth input, and arranged to provide a fourth input signal in response to the inverting input signal;

a second differential transistor pair that includes a fifth and sixth transistor, wherein the fifth transistor is arranged to provide a third current in response to the third input signal, and wherein the sixth transistor is arranged to provide a fourth current in response to the fourth input signal, wherein the third and fourth currents flow into a fourth node that is common between the fifth transistor and the sixth transistor;

a seventh transistor that is coupled between the third source follower circuit and a low power supply node, wherein the seventh transistor includes a control terminal that is coupled to a fifth node;

an eighth transistor that is coupled between the fourth source follower circuit and the low power supply node, wherein the eighth transistor includes a control terminal that is coupled to the fifth node;

a second current source that is coupled between the fifth node and the low power supply node; and a second voltage source that is coupled between the fourth node and the fifth node.

* * * * *